United States Patent [19]
Maue et al.

[11] Patent Number: 5,655,927
[45] Date of Patent: Aug. 12, 1997

[54] HYBRID JUNCTION BOX AND JUMPER CLIP

[75] Inventors: H. Winston Maue, Farmington Hills; George A. Wooldridge, Warren, both of Mich.

[73] Assignee: United Technologies Automotive, Inc., Dearborn, Mich.

[21] Appl. No.: 478,012

[22] Filed: Jun. 7, 1995

Related U.S. Application Data

[62] Division of Ser. No. 342,646, Nov. 21, 1994, Pat. No. 5,478,244, which is a continuation of Ser. No. 73,899, Jun. 9, 1993, abandoned.

[51] Int. Cl.$^6$ ................................................ H01R 31/08
[52] U.S. Cl. .......................................... 439/510; 439/852
[58] Field of Search .................................. 439/507–514, 439/852

[56] References Cited

U.S. PATENT DOCUMENTS

| | | | |
|---|---|---|---|
| 3,486,160 | 12/1969 | Wallace, Jr. | 439/510 |
| 3,555,497 | 1/1971 | Watanabe . | |
| 3,701,071 | 10/1972 | Landman . | |
| 3,713,080 | 1/1973 | Kennedy | 439/852 |
| 3,932,013 | 1/1976 | Yeager et al. | 439/510 |
| 4,135,226 | 1/1979 | Kourimsky . | |
| 4,208,080 | 6/1980 | Teagno . | |
| 4,255,004 | 3/1981 | Kourimsky et al. . | |
| 4,355,853 | 10/1982 | Kourimsky . | |
| 4,602,834 | 7/1986 | Hahn et al. . | |
| 4,689,718 | 8/1987 | Maue et al. . | |
| 4,703,397 | 10/1987 | Minoura et al. . | |
| 4,798,545 | 1/1989 | Roy et al. | 439/677 |
| 4,850,884 | 7/1989 | Sawai et al. | 439/76 |
| 4,906,195 | 3/1990 | Kubota et al. . | |
| 4,997,390 | 3/1991 | Scholz et al. | 439/509 |
| 5,023,752 | 6/1991 | Detter et al. | 439/76 |
| 5,040,097 | 8/1991 | Stribel | 439/76 |
| 5,057,026 | 10/1991 | Sawai et al. | 439/76 |
| 5,106,324 | 4/1992 | Natsume | 439/510 |
| 5,148,596 | 9/1992 | Zahn | 29/842 |
| 5,154,647 | 10/1992 | Ishitani et al. | 525/66 |
| 5,160,274 | 11/1992 | Ozaki et al. | 439/212 |
| 5,207,591 | 5/1993 | Ozaki et al. | 439/212 |

FOREIGN PATENT DOCUMENTS

2409660A1  9/1975  Germany .

*Primary Examiner*—Neil Abrams
*Attorney, Agent, or Firm*—Harness, Dickey & Pierce, P.L.C.

[57] ABSTRACT

The present invention hybrid junction box 11 joins two or more external electric current carrying members within a vehicle electrical system 14 and is comprised of a protective cover 31 and a protective housing 39 which define a casing having a cavity therewithin where a plurality of internal electric current carrying circuits are juxtaposed. The internal electric current carrying circuits may include at least one conducive deposited metal trace directly on the casing. Furthermore, a junction box 11 of the present invention has a plurality of internal electric current carrying circuits which may additionally include a flexible printed circuit board 37. Moreover, a junction box of the present invention provides for use of a rigid printed circuit board 33 and/or a busbar and insulator assembly 35 in combination with either or both the conductive deposited metal traces 67 and the flexible printed circuit board 37. The present invention is also comprised of various methods for electrically connecting together the various combinations of the preceding internal electric current carrying circuits. The present invention further uses a jumper box interconnect 193 to provide a programmed function within the busbar and insulator assembly 35.

13 Claims, 5 Drawing Sheets

HYBRID JUNCTION BOX AND JUMPER CLIP

This is a divisional of U.S. patent application Ser. No. 08/342,646, filed Nov. 21, 1994, entitled "Power Distribution Box And System", which issued as U.S. Pat. No. 5,478,244, which is a continuation of U.S. patent application Ser. No. 08/073,899, filed Jun. 9, 1993, abandoned.

BACKGROUND OF THE INVENTION

This invention relates generally to electrical systems within automotive vehicles and specifically to a junction box electrically connected therein.

Before the introduction of junction box technology, wire harnesses for each automotive vehicle had to be individually tailored for particular vehicle options. Wire harnesses were extremely complex, required complex and costly splicing, and necessitated high labor costs throughout the manufacturing process.

With the introduction of junction boxes for connecting various wire harnesses together, the wire harness complexity and costs were reduced while the quality and reliability of the vehicle electrical system were enhanced. Two conventional constructions of internal electric current carrying circuits are known. The first uses alternating layers of conductive busbars and insulators. The busbars have male blades which protrude upward through slots in each insulating layer. Furthermore, external wire harnesses are connected directly to many of these busbar male blades. This first construction is generally shown in the following U.S. Pat. No. 5,207,591 entitled "Branch Junction Box and Busbars for Branch Connection" which issued to Ozaki et al. on May 4, 1993; U.S. Pat. No. 5,160,274 entitled "Branch Junction Box and Busbars for Branch Connection" which issued to Ozaki et al. on Nov. 3, 1992; U.S. Pat. No. 5,154,647 entitled "Electrical Junction Block for Automobile and a Method for Manufacturing the Same" which issued to Ishitani et al. on Oct. 13, 1992; and, U.S. Pat. No. 4,850,884 entitled "Controller-Including Wiring Apparatus for Automotive Vehicle" which issued to Sawai et al. on Jul. 25, 1989. The second traditional junction box construction consists of a plurality of printed circuit boards having male and female terminals projecting perpendicular therefrom. External wire harnesses and electronic modules can be connected to these various terminals. Such a construction is disclosed in the following U.S. Pat. No. 4,689,718 entitled "Programmable Junction Box" which issued to Maue et al. on Aug. 25, 1987; U.S. Pat. No. 4,703,397 entitled "Function Circuit Incorporating Type Wiring Device for Automobile" which issued to Minoura et al. on Oct. 27, 1987; and, U.S. Pat. No. 4,135,226 entitled "Automatic Junction Unit" which issued to. Kourimsky on Jan. 16, 1979. Moreover, the busbar and insulator construction and the printed circuit board construction are shown combined within the inside of a junction box in U.S. Pat. No. 4,355,853 entitled "Electrical Junction Box" which issued to Kourimsky on Oct. 26, 1982.

The preceding junction box designs have improved the reliability of electrical connections within the vehicle electrical system, however, these junction boxes have become increasingly complex to assemble, heavy and large due to the many added busbar and printed circuit board layers. Therefore, it is desirable to have an improved junction box that is relatively small, lightweight and of low cost while further having easy to assemble internal circuitry.

SUMMARY OF THE INVENTION

In accordance with the present invention, the preferred embodiment of a hybrid junction box for joining two or more external electric current carrying members within a vehicle electrical system is comprised of a protective cover and a protective housing which define a cavity therewithin where a plurality of internal electric current carrying circuits are juxtaposed. The internal electric current carrying circuits may include at least one conductive deposited metal trace. Furthermore, the internal electric current carrying circuits of the present invention may additionally include a flexible printed circuit board. Moreover, a junction box of the present invention provides for use of a ridged printed circuit board and/or a busbar and insulator assembly in combination with either or both the conductive deposited metal traces and the flexible printed circuit board. A further aspect of the present invention is comprised of various methods for electrically connecting together the various combinations of the preceding internal electric current carrying circuits. Another aspect of the present invention uses a jumper box interconnect to provide a programmed function within the busbar and insulator assembly.

The hybrid junction box of the-present invention has many advantages over the conventional constructions. For example, by using a variety of combinations of the conductive deposited metal traces, the flexible printed circuit board, the rigid printed circuit board, and the busbar and insulator assembly, the junction box has greater internal packaging flexibility so as to minimize the exterior size thereof. Moreover, a junction box with conductive deposited metal traces and/or a flexible printed circuit board has a relatively lower weight than does a convention junction box having only a rigid printed circuit board or a busbar and insulator assembly. Also, the junction box of the present invention is less expensive to assemble as compared to traditional designs. An additional advantage is that the present invention junction box provides a means for electrically interconnecting circuits having differing amperage range handling capabilities. Moreover, the various electrical interfaces between each combination of internal electric current carrying circuits within the present invention is reliable, low cost and easy to assemble.

Additional advantages and features of the present invention Will become apparent from the following description and the appended claims, taken in conjunction with the accompanying drawings.

DETAILED DESCRIPTION OF THE PREFERRED EMBODIMENTS

Figure 1:
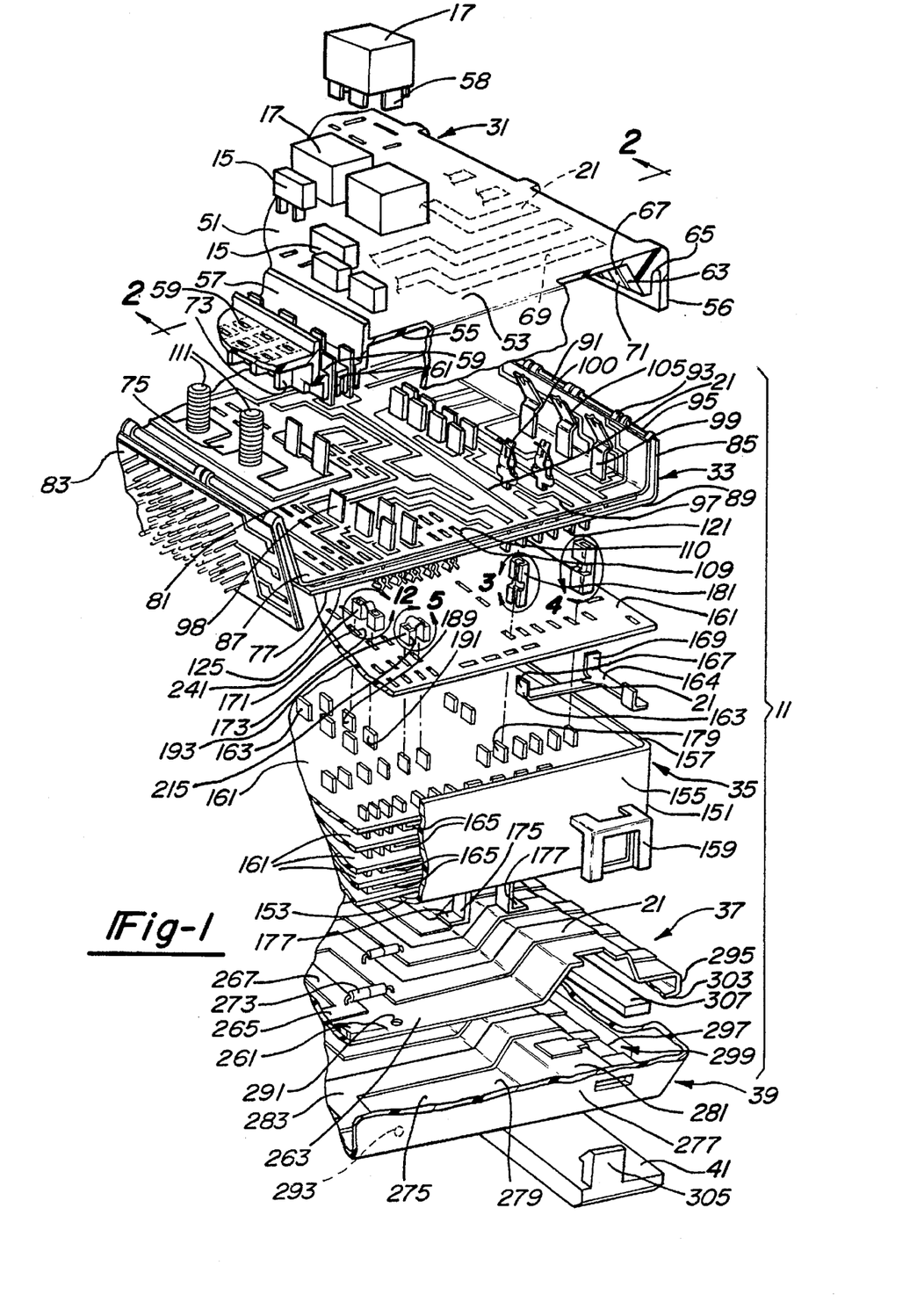
FIG. 1 is an exploded perspective view of the preferred embodiment of the hybrid junction box of the present invention.
Figure 2:
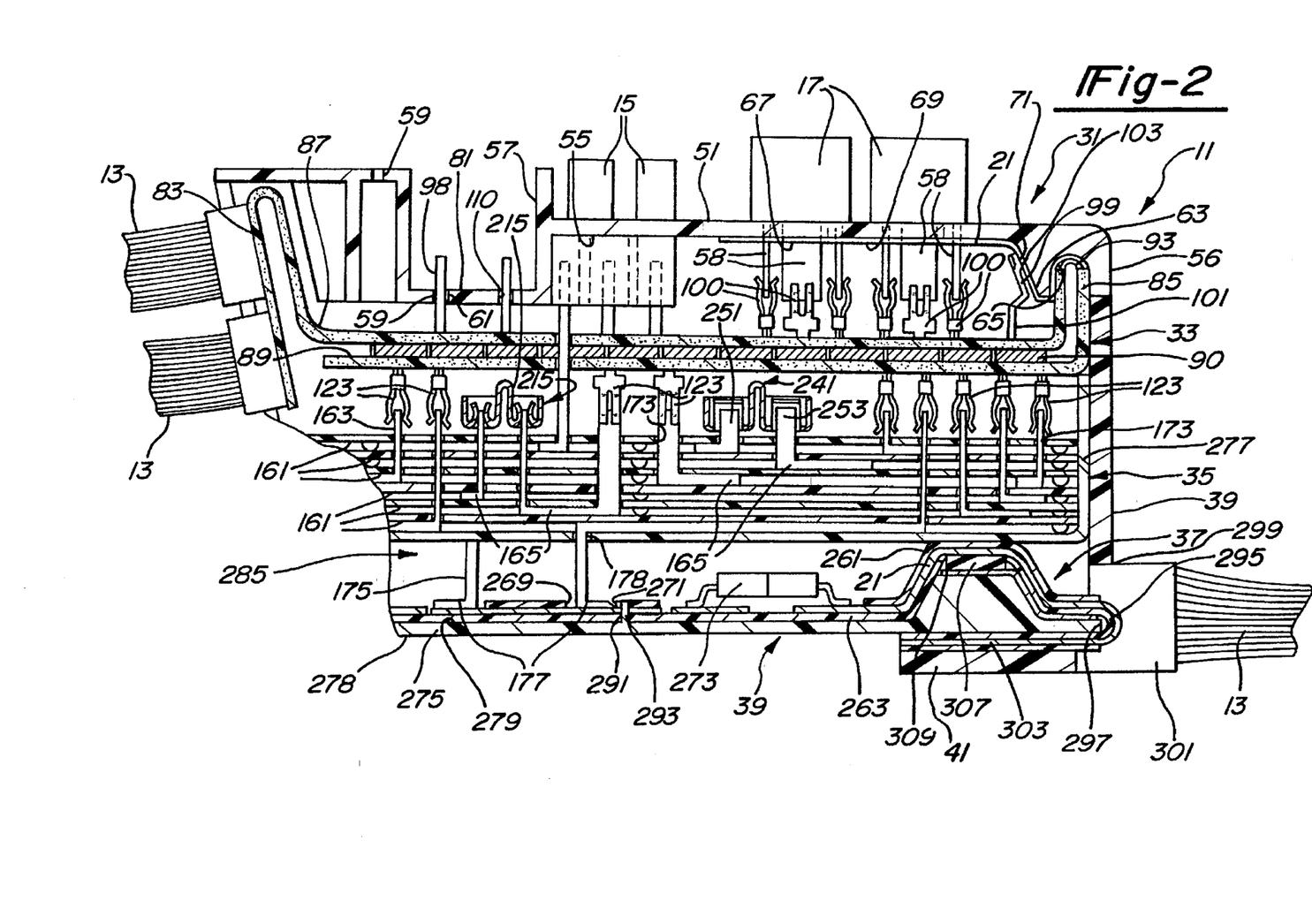
FIG. 2 is a cross sectional view of the present invention hybrid junction box in an assembled state, taken along line 2—2 of FIG. 1.
Figure 14:
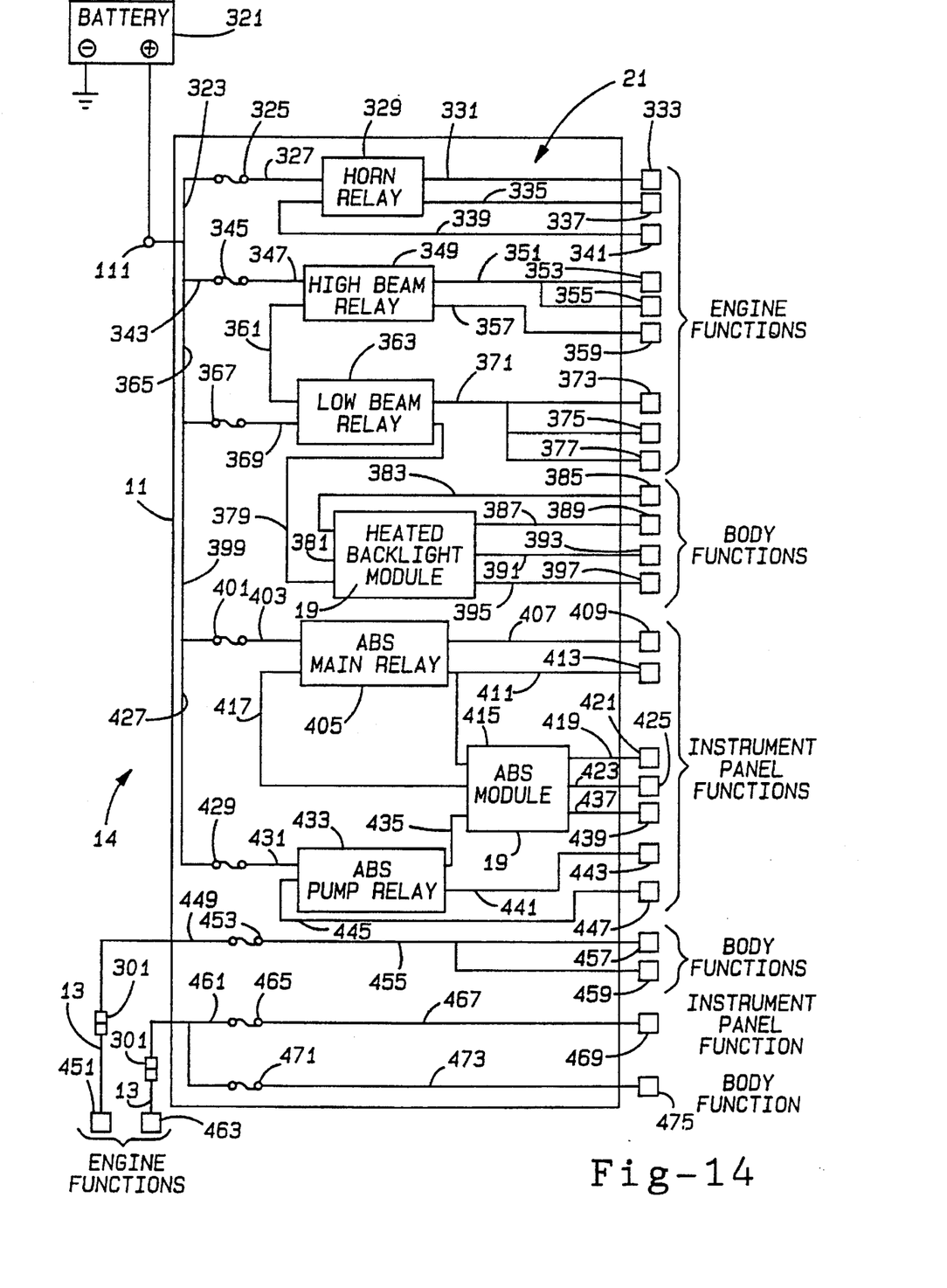
FIG. 14 is an electrical schematic diagram of the present invention hybrid junction box of FIG. 1 as used within an automotive vehicle electrical system.

Referring to FIGS. 1, 2 and 14, a hybrid junction box 11 of the present invention is used for joining external electric current carrying members such as wire harnesses 13 within an automotive vehicle electrical system 14. Junction box 11 also has provisions for retaining and electrically connecting fuses 15 and relays 17. Additionally, various electronics and control modules, such as ABS module 19, may be joined to or integrated within junction box 11. An example of such electronics and control modules are shown in U.S. Pat. No. 5,040,168 entitled "Single Wire, Infrared, Randomly Reflected, Vehicular Multiplexing System" which issued on Aug. 13, 1991 to Maue et al., and U.S. Pat. No. 4,534,025 entitled "Vehicle Multiplex System Having Protocol/Format For Secure Communication Transactions" which issued on Aug. 6, 1985 to Floyd; both of these patents have a common assignee with the present invention and are incorporated by reference herewithin. Junction box 11 serves to electrically connect wire harnesses 13, fuses 15, relays 17, and the various other electronics and control modules 19 through internal electric current carrying circuits 21. Accordingly, the preferred embodiment of junction box 11 is comprised of a cover 31, a rigid printed circuit board 33, a busbar and insulator assembly 35, a flexible printed circuit board 37, a housing 39 and a support bar 41 cover 31 and housing 39 define a casing.

As is shown in FIGS. 1 and 2, cover 31 is an injection molded dielectric part having a substantially flat central portion 51 defined by an exterior surface 53 and an interior surface 55 which are bordered by downwardly extending side walls 56. Fuses 15 and relays 17 are positioned proximate with exterior surface 53 of cover 31 and have conductive blades 58 protruding therethrough. Furthermore, central portion 51 contains at least one receptacle 57 for interface with a wire harness connector (not shown) or external control module (not shown). Moreover, a plurality of slots 59, defined by a rectangularly-shaped inside edge 61, transversely extend through receptacle 57 and central portion 51. An angled wall 63 protrudes from interior surface 55 of cover 31 and is generally oriented in a similar direction to that of side wall 56. Angled wall 63 and the adjacent side wall 56 are separated by a channel 65. On interior surface 55 of cover 31 there are a plurality of conductive deposited metal traces 67 patterned thereupon; cover 31 acts as a substrate for these conductive deposited metal traces 67. In general, exemplary methods of producing deposited metal traces 67 onto a substrate are disclosed in U.S. Pat. Nos. 4,853,277 and 4,797,508, both of which are entitled "Method For Producing Circuit Boards With Deposited Metal Patterns And Circuit Boards Produced Thereby" and are incorporated by reference herewithin. Each deposited metal trace 67 has a medial segment 69, which is adjacent to interior surface 55 of central portion 51, and an angled segment 71 which is proximate with angled wall 63. Additionally, a plurality of honeycomb formations 73 project perpendicularly from portions of interior surface 55 of cover 31. These honeycomb formations 73 are rectangularly-shaped in a vertical direction, as oriented in FIG. 1, and are hollow therein. Each slot 59 usually extends through cover 31 coincident with each honeycomb formation 73. Cover 31 is made from Noryl PX1265 which is produced by General Electric Plastics.

Rigid printed circuit board 33 has a first surface 75 and a substantially parallel second surface 77. Printed circuit board 33 also has a center portion 81 bordered by an angled end 83 and an upstanding end 85. Furthermore, printed circuit board 33 is folded back upon itself such that there is a top layer 87 and a bottom layer 89 which are oriented in parallel planes along center portion 81 and upstanding end 85. Top and bottom layers, respectively 87 and 89, are separated by a flat nonconductive sheet 90. An insulating substrate material 91 is stripped away from a conductive circuit layer 93 at an edge 95 of upstanding end 85. This provides for easy folding between top and bottom layers 87 and 89, respectively. Printed circuit board 33 also has electronics electrically mounted thereupon which serve as internal control modules 19 (see FIG. 14).

Top layer 87 of printed circuit board 33 is further comprised of a plurality of conductive paths 97 with a plurality of male blades 98, a plurality of finger terminals 99 and a plurality of female terminals 100 projecting perpendicular from said first surface 75 thereof. As can best be seen in FIGS. 1 and 2, each finger terminal 99 has a substantially straight section 101 soldered to top layer 87 of printed circuit board 33 and has an angled section 103 which extends in an offset fashion above straight section 101. Furthermore, a bead 105 is stamped centrally within angled section 103 to provide structural integrity. When cover 31 and printed circuit board 33 are assembled within junction box 11, electrical connections are made between angled section 103 of finger terminals 99 and angled segment 71 of deposited metal traces 67. In a free state, each finger terminal 99 is biased beyond angled segment 71 of cover deposited metal trace 67 thereby ensuring that a reliable electrical contact is made. Moreover, when assembled, exposed conductive circuit layer 93 at upstanding end 85 of printed circuit board 33 are in biased electrical contact with corresponding deposited metal traces 67 in channel 65. Female terminals 100 serve to electrically connect and mechanically retain fuses 15 and relays 17.

Center portion 81 of printed circuit board 33 is further provided with a plurality of slots 109 extending transversely therethrough. These slots 109 are defined by rectangularly-shaped edges 110 within printed circuit board 33. Also, a pair of battery terminals 111 project upward from center portion 81 of printed circuit board 33. These battery terminals 111 extend through apertures (not shown) located within cover 31.

Figures 8, 9, 10, 11, 12, 13:
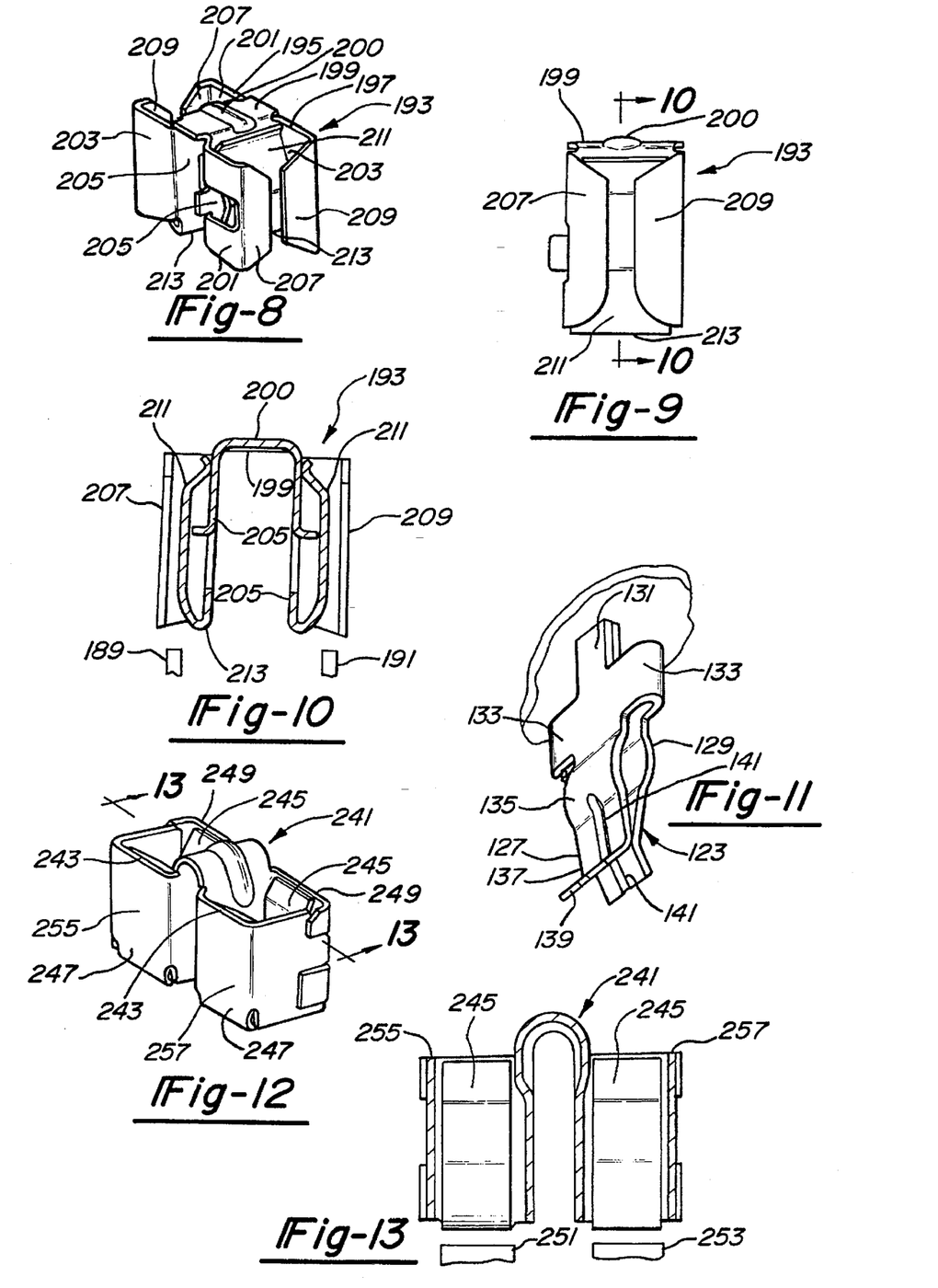
FIG. 8 is a perspective view of a first preferred embodiment of a jumper box interconnect of the present invention hybrid junction box, taken within circle 5 of FIG. 1.
FIG. 9 is a side elevational view of the first preferred embodiment of the jumper box interconnect of the present invention hybrid junction box of FIG. 8.
FIG. 10 is a sectional view of the first preferred embodiment of the jumper box interconnect of the present invention hybrid junction box, taken along line 10—10 of FIG. 9.
FIG. 11 is a perspective view of a female terminal projecting from a printed circuit board of the present invention hybrid junction box, taken with circle 11 of FIG. 1.
FIG. 12 is a perspective view of a third preferred embodiment of a jumper box interconnect of the present invention hybrid junction box, taken within circle 12 of FIG. 1.
FIG. 13 is a sectional view of the third preferred embodiment of the jumper box interconnect of the present invention hybrid junction box, taken along line 13—13 of FIG. 12.

Bottom layer 89 of printed circuit board 33 also has a plurality of electricity carrying paths (not shown), a plurality of male terminals 121, as can be seen in FIG. 1 and a plurality of female terminals 123. Male terminals 121 and female terminals 123 project perpendicular below a lower side 125 of bottom layer 89. Lower side 125 is coincidental to second surface 77 of printed circuit board 33. Referring to FIG. 11, female terminal 123 is comprised of a pair of symmetrically-shaped stampings 127 and 129 which are soldered to printed circuit board 33. Each stamping 127 and 129 of female terminal 123 has a narrow stem 131, a pair of outwardly extending arms 133, a bulbus segment 135, a contact segment 137 and a lead-in segment 139. Each contact segment 137 is designed with an overbend such that when a mating male blade is inserted therein each contact segment 137 will compress inwardly against opposite sides thereof. Lead-in segment 139 and compressive segment 137 also have a relief slot 141 cut longitudinally therethrough.

Busbar and insulator assembly 35 is located adjacent to second surface 77 of printed circuit board 33. This is best illustrated in FIGS. 1 and 2. Busbar and insulator assembly 35 is comprised of a container 151 having a base 153 surrounded by peripheral walls 155. Peripheral walls 155 are bordered by an edge 157 which is substantially open. Furthermore, an attachment structure 159 is integrally formed within portions of peripheral walls 155. Busbar and insulator assembly 35 is further comprised of a plurality of insulating layers 161 and a plurality of electrically conductive busbar layers 163, otherwise known as "frets." The alternating insulating layers 161 and busbar layers 163 are stacked within container 155 parallel to base 153. One or more busbars 164 are located within each busbar layer 163 and each busbar 164 has a substantially flat body 165 with a pair of upturned male blades 167 and 169 projecting therefrom. These busbars 164 are preferably stamped from a conductive metallic material such as hard copper or brass. Moreover, insulating layers 161 have a plurality of slots 171 transversely extending therethrough each being defined by a rectangular-shaped inside edge 173. Insulating layers 161 and busbar layers 163 are alternately layered on top of one another such that male blades 167 and 169 are juxtapositioned so as to extend through slots 171. Insulating layers 161 are made from a dielectric material such as Valox 732E which can be obtained from General Electric Plastics. Also, an omnidirectional busbar 175 is placed between an insulating layer 161 and base 153 of container 155. This omnidirectional busbar 175 has a plurality of L-shaped contacts 177 which extend through slots 178 in base 153.

Figures 3, 4:
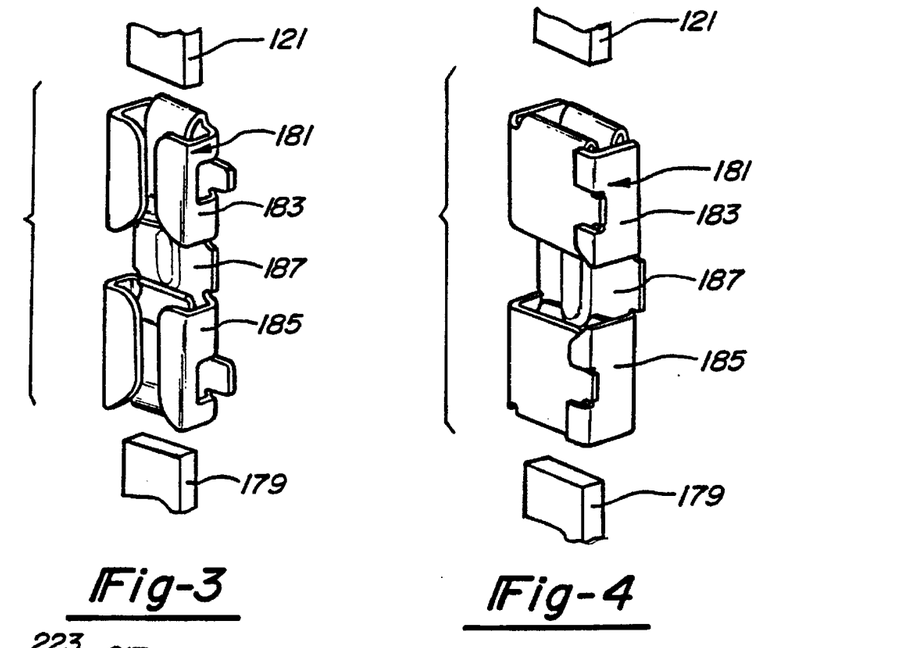
FIG. 3 is an enlarged perspective view of a first preferred embodiment of an aligned box interconnect of the present invention hybrid junction box, taken within circle 3 of FIG. 1.
FIG. 4 is an enlarged perspective view of a second preferred embodiment of an aligned box interconnect of the present invention hybrid junction box, taken within circle 4 of FIG. 1.
Figures 5, 6, 7:
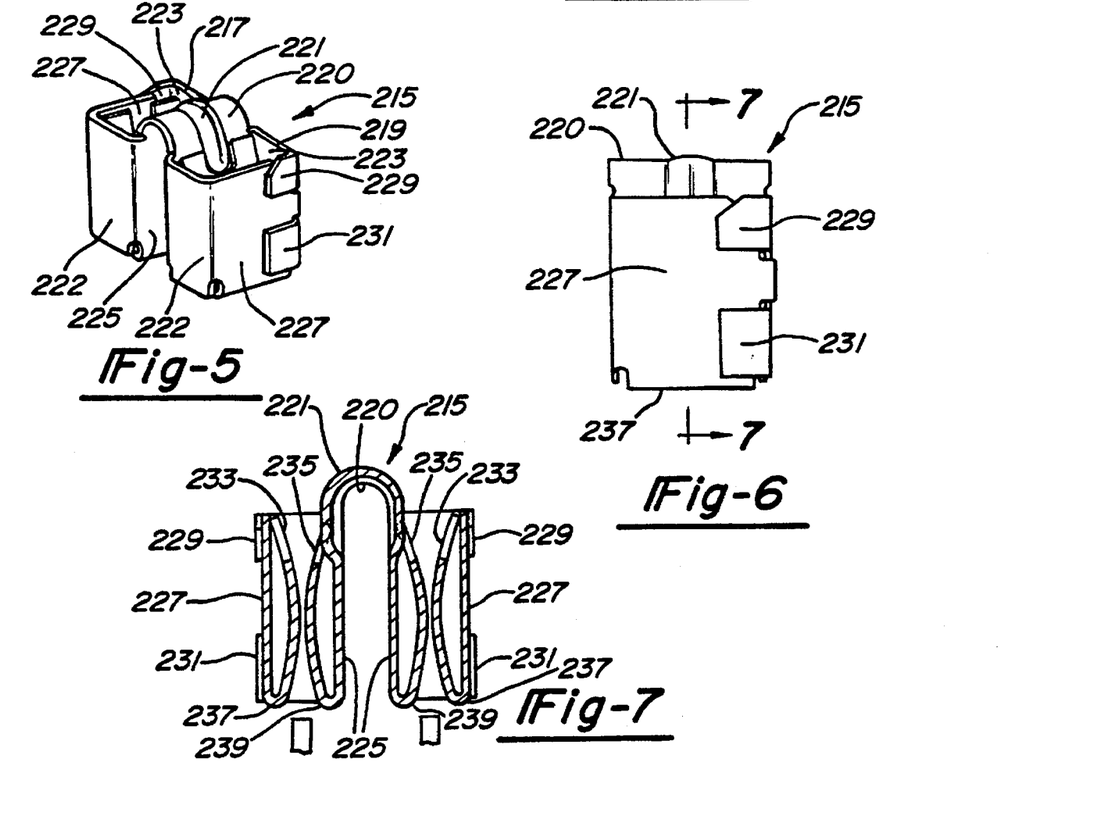
FIG. 5 is an enlarged perspective view of a second preferred embodiment of a jumper box interconnect of the present invention hybrid junction box, taken within circle 5 of FIG. 1.
FIG. 6 is a side elevational view of the second preferred embodiment of the jumper box interconnect of the present invention hybrid junction box of FIG. 5.
FIG. 7 is a sectional view of the second preferred embodiment of the jumper box interconnect of the present invention hybrid junction box, taken along line 7—7 of FIG. 6.

A majority of male blades 167 and 169 of busbar and insulator assembly 35 mate with female terminals 123 extending from second surface 77 of printed circuit board 33 when junction box 11 is assembled. Other male blades, such as those denoted as 179, are electrically connected to oppositely extending male terminals 121 which also project from second surface 77 of printed circuit board 33. Each male to male electrical connection is made through an aligned box terminal interconnect 181. As can best be observed in FIGS. 3 and 4, two differing preferred embodiment constructions are shown wherein each aligned box terminal, interconnect 181 is comprised of a pair of stacked box sections 183 and 185 which are joined by a straight spine 187. Such aligned box terminal interconnects are generally known to one skilled in the rigid printed circuit board art as a method of making an electrical connection between male to male blades.

In a further aspect of the present invention, other pairs of male blades, such as those denoted as 189 and 191, are electrically connected to one another by a jumper box interconnect 193. Jumper box interconnect 193 provides a programmed logic function to the circuits within busbar and insulator assembly 35. In other words, jumper box interconnect 193 allows for flexibility in the functionality of junction box 11. In certain embodiments, the engine, body and instrument panel functions controlled by busbars 164 can be combined by using jumper box interconnects 193. In other embodiments, the functions controlled by busbars 164 can be separated by removing jumper box interconnects 193.

A first preferred embodiment of jumper box interconnect 193 of the present invention is shown in FIGS. 1, and 8–10. Jumper box interconnect 193 is constructed from a pair of box sections 195 and 197 with a bent bridge 199 therebetween. Furthermore, a structural bead 200 is formed within bridge 199. Each box section 195 and 197 is further defined by a pair of side walls 201 and 203 joined by a back wall 205 which, in turn, extends into bridge 199. A pair of flaps 207 and 209 wrap toward one another from side walls 201 and 203, respectively, within each box section 195 and 197. An S-shaped tongue 211 curves outward and is folded back from a bottom edge 213 of each back wall 205. When male blades 189 and 191 are inserted within their respective box sections 195 and 197, tongues 211 compress male blades 189 and 191 against the opposing flaps 207 and 209. Jumper box interconnect is made from tin plated C110 copper or beryllium copper.

Referring to FIGS. 1, 2 and 5–7, a second preferred embodiment of the present invention jumper box interconnect 215 is comprised of a pair of box sections 217 and 219 joined by a bridge 220. A structural bead 221 is formed within bridge 220. Each box section 217 and 219 is further comprised of a first side wall 222 and a second side wall 223 both of which are connected by a back wall 225. An outwardly facing wall 227 extends from first side wall 222 and defines a plane substantially parallel to another plane defined by back wall 225. Back walls 225 of each box section 217 and 219 are spatially interposed from one another such that each plane defined thereby is substantially parallel to each other. Furthermore, second side wall 223 has a pair of relatively small flaps 229 and 231 extending perpendicular therefrom and engaging a portion of outwardly facing wall 227 thereagainst. Each box section 217 and 219 also has a first and second tongue, respectively 233 and 235 compressibly juxtapositioned therein. First tongue 233 is folded inward from a bottom edge 237 of outwardly facing wall 227 and second tongue 235 is folded inward from a bottom edge 239 of back wall 225.

Alternately, a third preferred embodiment of the present invention jumper box interconnect 241 is shown in FIGS. 2, 12 and 13. This construction is similar to that of the second preferred embodiment, however, a pair of tongues 243 and 245 extend inward from side walls 247 and 249. When jumper box interconnect 241 is mounted onto male blades 251 and 253, tongues 243 and 245 within each box section 255 and 257 compress against the flat faces of each male blade 251 and 253 thereby providing an electrical connection.

When cover 31 and printed circuit board 33 are installed adjacent to busbar and insulator assembly 35, various male blades, such as those denoted as 163, will extend through slots 109 within printed circuit board 33 and through slots 59 within cover 31. Each honeycomb structure 73 also provides additional support to these adjacent male blades 163. Therefore, an external connector (not shown) such as one from a wire harness 13 or control module 19 can be electrically connected thereto.

Referring to FIGS. 1 and 2, flexible printed circuit board 37 is comprised of upper and lower Mylar film sheets 261 and 263, respectively, having a conductive layer of thin metallic foil 265 therebetween. Metallic foil 265 is cut into individual circuits 267 for providing internal electric current carrying paths. Such a flexible printed circuit board is generally described within exemplary U.S. Pat. No. 5,084,124 entitled "Flexible Printed Circuit Board and Coverlay Film and Method of Manufacturing Same," which is incorporated by reference herewithin. Upper Mylar layer 261 is provided with a plurality of orifices 269 which are defined by quadrilaterally-shaped inside edges 271 such that L-shaped terminals 177 of busbar and insulator assembly 35 can electrically connect and compress against the congruent circuits 267 of flexible printed circuit board 37. Flexible printed circuit board 37 also contains various electronics such as diodes 273.

Housing 39 has a base 275 and a set of side walls 277 thereabout. Base 275 of housing 39 further has an exterior surface 278 and an interior surface 279 with a raised portion 281 extending thereacross. A plurality of conductive deposited metal traces 283 are patterned on interior surface 279 of housing 39. Housing 39 acts as a substrate for conductive deposited metal traces 283. Interior surface 279 of housing 39 and interior surface 55 of cover 31 define a cavity 285 therein.

Flexible printed circuit board 37 is mounted upon interior surface 279 of housing 39. Additionally, a series of round openings 291 extend transversely through preselected portions of flexible printed circuit board 37 for alignment with a set of concentrically oriented pins 293 protruding from housing 39. Flexible printed circuit board 37 further has a peripheral portion 295 wrapped around an edge 297 which is created by a void 299 in a side wall 277 of housing 39. Various conductive circuits 267 are exposed at peripheral portion 295 for electrical connection to a wire harness connector 301 and, in turn, wire harness 13. A wrapped edge 303 of peripheral portion 295 is then trapped against exterior surface 278 of housing 39 by support bar 41. Support bar 41 further contains a set of snap fits 305 which is removably affixed to attachment structure 159 of busbar and insulator assembly container 151. Deposited metal traces 283 on housing 39 electrically interface with flexible printed circuit board 37 by a compressed conductive rubber pad 307. Such a compressed conductive rubber pad 307 is generally known to one skilled in the art for use in other applications. Alternately, orifices 309 located within bottom Mylar layer 263 of flexible printed circuit board 37 may provide direct electrical interface with deposited metal traces 283 of housing 39 by direct physical contact with one another.

A schematic circuit diagram of junction box 11 is shown in FIG. 14. A power source, such as a battery 321, supplies power to junction box 11 through battery terminals 111 electrically mounted to printed circuit board 33 (see FIGS. 1 and 2). Internal electric current carrying circuits 21 within junction box 11 are designed as follows: a path 323 is part of a first electrically conductive circuit, is located within busbar and insulator assembly 35 (see FIGS. 1 and 2) and electrically connects battery terminals 111 to a first fuse 325; a conductive path 327 is located within printed circuit board 33 and electrically connects first fuse 325 to a horn relay 329, path 327 is part of the first circuit; a path 331 is part of the second circuit and is located on printed circuit board 33 and electrically connects horn relay 329 to a first engine function 333; a path 335 is part of the first circuit and is located within busbar and insulator assembly 35; path 335 electrically connects horn relay 329 and a second engine function 337; an electrical path 339 is part of the first circuit and is located within the flexible printed circuit board 37 (see FIGS. 1 and 2), path 339 electrically connects horn relay 329 and a third engine function 341; an electrical path 343 is part of the first circuit and is located within busbar and insulator assembly 35, path 343 electrically connects battery terminals 111 to a second fuse 345; a path 347 is part of the second circuit, is located within busbar and insulator assembly 35 and electrically connects second fuse 345 and a high beam relay 349; an electrically conductive path 351 is part of the second circuit and is located within printed circuit board 33, path 351 electrically connects high beam relay 349 to fourth and fifth engine functions 353 and 355, respectively; a path 357 is part of a third circuit and is located within printed circuit board 33, path 357 electrically connects high beam relay 349 and a sixth engine function 359; a path 361 is part of the first circuit and is located with deposited metal circuit traces 283 of housing 39 (see FIGS. 1 and 2) and electrically connects high beam relay 349 to a low beam relay 363; an electrically conductive path 365 is part of the first circuit and is located within busbar and insulator assembly 35 and electrically connects battery terminals 111 to a third fuse 367; a conductive path 369 is part of the second circuit, is located within flexible printed circuit board 37 and electrically connects third fuse 367 to low beam relay 363; a path 371 is part of the third circuit and is located within flexible printed circuit board 37, path 371 electrically connects low beam relay 363 to a seventh engine function 373, an eighth engine function 375 and a ninth engine function 377; a path 379 is part of the third circuit, is located within busbar and insulator assembly 35 and electrically connects low beam relay 363 to a heated backlight module 381; a path 383 is part of the second circuit, is located within deposited metal circuit traces 283 and electrically connects heated backlight module 381 to a first body function 385; a path 387 is part of a fourth circuit and is located within busbar and insulator assembly 35, this path 387 electrically connects heated backlight module 381 and second body function 389; an electrical path 391 is part of the third circuit and is located within deposited metal circuit traces 67 of cover 31 (see FIGS. 1 and 2), path 391 electrically connects heated backlight module 381 with a third body function 393; a path 395 is part of the fourth circuit and is located within printed circuit board 33 and electrically connects heated backlight module 381 to a fourth body function 397; a path 399 is part of the first circuit, is located within busbar and insulator assembly 35 and electrically connects battery terminals 111 to a fourth fuse 401; an electrically conductive path 403 is part of a fifth circuit and is located within printed circuit board 33, path 403 electrically connects fourth fuse 401 to an anti-lock braking system (ABS) main relay 405; a path 407 is part of the fifth circuit and is located within busbar and insulator assembly 35, path 407 electrically connects ABS main relay 405 to a first instrument panel function 409; a path 411 is part of the fourth circuit and is located within deposited metal circuit traces 67 and electrically connects ABS main relay 405 to a second instrument panel function 41 3 and to an ABS module 415; a path 417 is part of the third circuit and is located within deposited metal circuit traces 283, path 41 7 electrically connects ABS main relay 405 to ABS module 415; path 419 is part of a sixth circuit and is located within busbar and insulator assembly 35, path 419 electrically connects ABS module 41 5 with a third instrument panel function 421; an electrically conductive path 423 is part of the sixth circuit and is located within printed circuit board 33 and electrically connects ABS module 41 5 to a fourth instrument panel function 425; a path 427 is part of the first circuit and is located within busbar and insulator assembly 35 and electrically connects battery terminals 111 to a fifth fuse 429; a path 431 is part of a seventh circuit and is located within flexible printed circuit board 37, path 431 electrically connects fifth fuse 429 to an ABS pump relay 433; a path 435 is part of the seventh circuit and is located within busbar and insulator assembly 35 and electrically connects ABS pump relay 433 and ABS module 415; a path 437 is part of the fourth circuit, and is located within deposited metal circuit traces 283 and electrically connects ABS module 415 to a fifth instrument panel function 439; an electrical path 441 is part of the fifth circuit and is located within deposited metal circuit traces 283 and electrically connects ABS pump relay 433 and a sixth instrument panel function 443; a path 445 is part of the fifth circuit and is located within deposited metal circuit traces 67 and electrically connects ABS pump relay 433 to a seventh instrument panel function 447; an internal electrically conductive path 449 is part of a sixth circuit and is located within deposited metal circuit traces 283, path 449 electrically connects an external wire harness 13 and, in turn, a tenth engine function 451, to a sixth fuse 453; a path 455 is part of the sixth circuit, is located within deposited metal circuit traces 67 and electrically connects sixth fuse 453 to a fifth body function 457 and a sixth body function 459; an internal electrically conductive path 461 is part of the sixth circuit and is located within flexible printed circuit board 37 and is electrically connected to a wire harness 13 which, in turn, is electrically connected to an eleventh engine function 463, power is then fed through path 461 to a seventh fuse 465; a path 467 is part of the fourth circuit and is located within flexible printed circuit board 37, path 467 electrically connects seventh fuse 465 with an eighth instrument panel function 469; a path 461 also supplies current from eleventh engine function 463 to an eighth fuse 471; and, a path 473 is part of the fifth circuit and is located within flexible printed circuit board 37 and electrically connects eighth fuse 471 with a seventh body function 475. Heated backlight module 381 and ABS module 415 are preferably integrated within junction box 11. Moreover, each engine, instrument panel and body function is connected to junction box 11 through wire harnesses 13.

One advantage of the present invention is the combination of high, medium and low electricity current carrying layers. For example, conductive deposited metal traces 63 contained within cover 31 and lower housing 39 primarily carry a low current of approximately 1–50 milliamps. The flexible printed circuit board 37 has an electricity carrying capacity for low and medium range currents. Such medium range currents may generally fall between 50 milliamps and 5 amps. Similarly, the printed circuit board 33 can handle low and medium range currents while the busbar and insulator assembly 35 can handle a high range of electrical currents of approximately 5–40 amps. Therefore, the junction box 11 of the present invention provides a means for electrically interfacing the preceding electric current carrying circuits which have differing amperage range handling capabilities.

While the preferred embodiments of this hybrid junction box and jumper box interconnects have been disclosed, it will be appreciated that various modifications may be made without departing from the present invention. For example, the present invention encompasses a junction box having conductive deposited metal traces therewithin. Furthermore, the present invention covers a junction box having flexible printed circuit board electrical conductors therewithin. Moreover, while a specific junction box having conductive deposited metal traces, a printed circuit board, a busboard and insulator assembly, and a flexible printed circuit has been disclosed, a junction box of the present invention may alternatively have any dissimilar paired combination of these electric current circuits therein. The junction box may also be oriented in any position and the internal layers may be stacked in a different order depending on the specific vehicle packaging requirements. Various materials have been disclosed in an exemplary fashion, however, a variety of Other materials may of course be employed. It is intended by the following claims to cover these and any other departures from the disclosed embodiments which fall within the true spirit of this invention.

The invention claimed is:

1. A jumper box interconnect for electrically connecting a pair of male blades in an automotive vehicle junction box comprising:

a pair of box sections each being defined by a back wall, a first side wall and a second side wall, said side walls extending perpendicularly from said back wall, a flexible tongue being attached to one of said walls adjacent to a first edge of each of said box sections, said pair of box sections receiving said pair of male blades from the same direction, said tongue compressing against one of said walls when one of said male blades is received in each of said pair of box sections; and a bentbridge electrically connecting and mechanically joining said back walls together along a second edge of each of said box sections opposite from said first edge, said back walls being spatially offset from one another such that each plane defined thereby is substantially parallel to one another.

2. The jumper box interconnect of claim 1 wherein:

each of said box sections further have a pair of flaps which wrap toward each other from said side walls, each of said tongues has a substantially S-shape which curves outward and is folded back from said first edge of said back wall, said tongue of each of said box sections compress said mating male blade against said opposing pair of flaps when assembled.

3. The jumper box interconnect of claim 1 wherein:

each of said box sections further have an outwardly facing wall which perpendicularly extends from said first side wall and defines a plane substantially parallel to that defined by said back wall, said second side wall has a pair of relatively small flaps which protrude perpendicularly therefrom and engage a portion of said outwardly facing wall thereagainst, each of said box sections also has a pair of tongues compressibly juxtapositioned therein where a first of said pair of tongues is folded back in an inward direction from a bottom edge of said outwardly facing wall and a second of said pair of tongues is folded back in an inward direction from a bottom edge of said back wall.

4. The jumper box interconnect of claim 1 wherein:

each of said box sections further have an outwardly facing wall which perpendicularly extends from said first side wall and defines a plane substantially parallel to that defined by said back wall, said second side wall has a pair of relatively small flaps which protrude perpendicularly therefrom and engage a portion of said outwardly facing wall, each of said box sections also has a second compressible tongue, where said tongues are folded back in an inward direction from said first edge of each of said pair of side walls.

5. An apparatus for electrically connecting a pair of conductive members comprising:

a pair of sections each being defined by a back wall and a pair of tongues, said pair of sections being further defined as box sections having a substantially identical configuration, said pair of sections receiving said pair of conductive members from the same direction between said pairs of tongues; and a bent bridge electrically connecting and mechanically joining said back walls together, said back walls being spatially separated from one another.

6. The apparatus of claim 5 wherein each of said pair of sections are removably coupleable to a mating one of said conductive members.

7. The apparatus of claim 6 wherein said pair of conductive members are defined as male blades.

8. The apparatus of claim 6 further comprising an automotive junction box containing a plurality of said pair of conductive members, said pair of sections being movable to provide different circuit path means within said junction box depending on desired vehicle options.

9. The apparatus of claim 5 further comprising an automotive junction box containing said pair of conductive members as part of an alternating fret and insulator assembly.

10. The apparatus of claim 5 wherein each plane defined by said back walls is substantially parallel to one another.

11. The jumper box interconnect of claim 5 wherein:

each of said box sections further have a pair of flaps which wrap toward each other from said side walls, each of said tongues has a substantially S-shape which curves outward and is folded back from a bottom edge of said back wall, said tongue of each of said box sections compress a corresponding one of said pair of conductive members against said opposing pair of flaps when assembled.

12. The jumper box interconnect of claim 5 wherein:

each of said box sections further have an outwardly facing wall which perpendicularly extends from said first side wall and defines a plane substantially parallel to that defined by said back wall, said second side wall has a pair of relatively small flaps which protrude perpendicularly therefrom and engage a portion of said outwardly facing wall, each of said box sections also has a second compressible tongue, where a first pair of tongues is folded back in an inward direction from a bottom edge of said outwardly facing wall and a second of said pair of tongues is folded back in an inward direction from a bottom edge of said back wall.

13. The jumper box interconnect of claim 5 wherein:

each of said box sections further have an outwardly facing wall which perpendicularly extends from said first side wall and defines a plane substantially parallel to that defined by said back wall, said second side wall has a pair of relatively small flaps which protrude perpendicularly therefrom and engage a portion of said outwardly facing wall, each of said box sections also has a second compressible tongue, where said tongues are folded back in an inward direction from a bottom edge of each of said pair of side walls.

* * * * *